United States Patent
Umehara et al.

(10) Patent No.: US 7,535,755 B2
(45) Date of Patent: May 19, 2009

(54) MAGNETIC MEMORY DEVICE AND METHOD FOR FABRICATING THE SAME

(75) Inventors: Shinjiro Umehara, Kawasaki (JP); Hiroshi Ashida, Kawasaki (JP); Takao Ochiai, Kawasaki (JP); Masashige Sato, Kawasaki (JP); Kazuo Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 161 days.

(21) Appl. No.: 11/528,367

(22) Filed: Sep. 28, 2006

(65) Prior Publication Data

US 2007/0241410 A1 Oct. 18, 2007

(30) Foreign Application Priority Data

Mar. 30, 2006 (JP) ............................. 2006-093404

(51) Int. Cl.
*G11C 11/00* (2006.01)
(52) U.S. Cl. ..................... 365/158; 365/171; 365/173
(58) Field of Classification Search ................ 365/158, 365/171, 173
See application file for complete search history.

(56) References Cited

U.S. PATENT DOCUMENTS

| | | | |
|---|---|---|---|
| 6,759,081 B2 * | 7/2004 | Huganen et al. .............. | 427/58 |
| 7,133,264 B2 * | 11/2006 | Mauri et al. ........... | 360/324.11 |
| 7,280,325 B1 * | 10/2007 | Pan ........................ | 360/324.12 |
| 7,336,556 B2 * | 2/2008 | Okayama et al. ............ | 365/232 |
| 2005/0276099 A1 * | 12/2005 | Horng et al. ................. | 365/158 |

FOREIGN PATENT DOCUMENTS

| | | |
|---|---|---|
| JP | 2003-249630 A | 9/2003 |
| JP | 2004-241672 A | 8/2004 |
| JP | 2004-259913 A | 9/2004 |
| JP | 2004-281599 A | 10/2004 |
| JP | 2005-94002 A | 4/2005 |

* cited by examiner

*Primary Examiner*—Pho M. Luu
(74) *Attorney, Agent, or Firm*—Fujitsu Patent Center

(57) ABSTRACT

The magnetic memory device includes a magnetic shield film 48, and a magnetoresistive effect element 62 formed over the magnetic shield film 48 and including a magnetic layer 52, a non-magnetic layer 54 and a magnetic layer 56, in which a magnetization direction of the first magnetic layer or the second magnetic layer is reversed by spin injection, and a second magnetic shield film 68 formed over the side wall of the magnetoresistive effect element 62. Thus, the arrival of the leakage magnetic field from the interconnection near the magnetoresistive effect element 62 can be effectively prevented.

11 Claims, 8 Drawing Sheets

MAGNETIC MEMORY DEVICE AND METHOD FOR FABRICATING THE SAME

CROSS-REFERENCE TO RELATED APPLICATIONS

This application is based upon and claims the benefit of priority from the prior Japanese Patent Application No. 2006-093404, filed on Mar. 30, 2006, the entire contents of which are incorporated herein by reference.

BACKGROUND OF THE INVENTION

The present invention relates to a magnetic memory device and a method for fabricating the same, more specifically, a magnetic memory device using a spin injection-type magnetoresistive effect element and a method for fabricating the magnetic memory device.

Recently, as a rewritable nonvolatile memory a magnetic random access memory (hereinafter called an MRAM) including magnetoresistive effect elements arranged in a matrix is noted. The MRAM uses combinations of magnetization directions of two magnetic layers to memorize information and, to read the information, detects resistance changes (i.e., current changes or voltage changes) between the resistance with the magnetization directions of the two magnetic layers being parallel with each other and the resistance with the magnetization directions of the two magnetic layers being anti-parallel with each other.

As the magnetoresistive effect element forming the MRAM are known the GMR (Giant Magnetoresistive) element and the TMR (Tunneling Magnetoresistive) element. Of them, the TMR element, which provides large resistance changes, is noted as the magnetoresistive effect element to be used in the MRAM. The TMR element includes two ferromagnetic layers laid one on another with a tunnel insulating film formed therebetween and utilizes the phenomena that the tunnel current which flows between the magnetic layers via the tunnel insulating film changes based on relationships of the magnetization directions of the two ferromagnetic layers. That is, the TMR element has low element resistance when the magnetization directions of the two ferromagnetic layers are parallel with each other and has high element resistance when both are anti-parallel with each other. These two states are related to data "0" and data "1" to use the TMR element as a memory device.

As the method for writing in the magnetoresistive effect element, the method (current magnetic field writing method) of flowing current in two signal lines (e.g., a bit line and a write word line) which normally intersect each other and applying a synthetic magnetic field of magnetic fields generated from the signal lines to the TMR element to thereby change a magnetization direction of one of the ferromagnetic layer (free magnetization layer) corresponding to the applied magnetic field is generally used.

However, in this method, the electric power consumption and reliability depend on the generation efficiency of the synthetic magnetic field generated by the bit line and the write word line and the ease of inversion of the free magnetization layer to the external magnetic field. Especially, as the size of the magnetoresistive effect element is more diminished for higher memory density, the demagnetizing field of the free magnetization layer is increased, which increases the magnetization reversal magnetic field Hc of the free magnetization layer. That is, as the integration is higher, the write current is increased, and the electric power consumption is increased.

To solve this, the so-called clad structure, in which the surroundings of the bit line and the write word line except the surfaces opposed to the magnetoresistive effect element are shielded to concentrate the magnetic fluxes, is proposed. However, the magnetization reversal magnetic field of the free magnetization layer is increased in inverse proportion with the decrease of the size, and the conventional current magnetic writing method drastically increases the write current, which will really make the write difficult.

In writing data, current is applied to the bit line and the write word line to inverse the magnetization of the free magnetization layer of prescribed selected element by the synthetic magnetic fields. At this time, the current magnetic fields act on a number of non-selected elements connected to the bit line and the write word line the current was applied to. The elements in such state are defined as to be in half-selected state; the magnetization reversal tends to unstably take place, which is a cause for erroneous operations. In the MRAM with the select transistor connected to, the write word line for writing is necessary in addition to the bit lines and the word lines, which complicates the device structure and the fabrication process.

In view of this, recently, the spin injection magnetization reversal element is noted. The spin injection magnetization reversal element is a magnetoresistive effect element including two magnetic layers with an insulating film or a nonmagnetic metal layer formed therebetween, as do the GMR element and the TMR element.

In the spin injection magnetization reversal element, when current is flowed from the free magnetization layer to the pinned magnetization layer perpendicularly to the film surface, the spin polarized conduction electrons flow from the pinned magnetization layer to the free magnetization layer to make the exchange interaction with the electrons in the free magnetization layer. Resultantly, torque is generated between the electrons, and when the torque is sufficiently large, the magnetic moment of the free magnetization layer is inverted from anti-parallel to parallel. On the other hand, when the current is oppositely applied, the effect of the action opposite to the above can inverse the magnetic moment from parallel to anti-parallel. That is, the spin injection magnetization reversal element is a memory element which can induce the magnetization reversal of the free magnetization layer by the current control alone to rewrite a memory state.

The spin injection magnetization reversal element, in which even when the element size is decreased, and the magnetization reversal magnetic field Hc is increased, the inversion current is decreased due to the effect of the decreased volume, is very advantageous to increase the capacity and decrease the electric power consumption in comparison with the current magnetic field writing element. Furthermore, no write word lines are necessary, which allows the device structure and the fabrication method to be simplified.

Related arts are disclosed in, e.g., Reference 1 (Japanese published unexamined patent application No. 2003-249630), Reference 2 (Japanese published unexamined patent application No. 2004-241672), Reference 3 (Japanese published unexamined patent application No. 2004-259913), Reference 4 (Japanese published unexamined patent application No. 2004-281599) and Reference 5 (Japanese published unexamined patent application No. 2005-094002).

However, in the magnetic memory device using the spin injection magnetization reversal element, the magnetization reversal of the free magnetization layer is induced by leakage magnetic field from interconnections near the magnetoresistive effect element.

SUMMARY OF THE INVENTION

An object of the present invention is to provide a magnetic memory device using spin injection magnetization reversal element, which can prevent erroneous operations due to leakage magnetic field from interconnection disposed near the magnetoresistive effect element, and a method for fabricating the magnetic memory device.

According to one aspect of the present invention, there is provided a magnetic memory device comprising: a first magnetic shield film; a magnetoresistive effect element formed over the first magnetic shield film and including a first magnetic layer, a non-magnetic layer formed on the first magnetic layer and a second magnetic layer formed on the non-magnetic layer, in which a magnetization direction of the first magnetic layer or the second magnetic layer is reversed by spin injection; and a second magnetic shield film formed over a side wall of the magnetoresistive effect element.

According to another aspect of the present invention, there is provided a method for fabricating a magnetic memory device comprising the steps of: forming a first magnetic shield film; forming over the first magnetic shield film a magnetoresistive effect element including a first magnetic layer, a non-magnetic layer formed on the first magnetic layer and a second magnetic layer formed on the non-magnetic layer; and forming a second magnetic shield film over a side wall of the magnetoresistive effect element.

According to the present invention, the undersurface of the magnetoresistive effect element is covered with a first magnetic shield film and the side wall of the magnetoresistive effect element is covered with a second magnetic shield film, whereby the arrival of the leakage magnetic field from the interconnections near the magnetoresistive effect element can be effectively prevented. Thus, the erroneous operations, such as the magnetization reversal of the free magnetization layer of the magnetoresistive effect element and the fluctuation of the writing current, due to the leakage magnetic field from the interconnections near the magnetoresistive effect element can be prevented.

The second magnetic shield film is provided with the moisture-resistant insulating film formed therebetween, whereby the arrival of impurities, such as oxygen, water, hydrogen, etc., at the magnetoresistive effect element can be effectively prevented. Thus, in the fabrication process following the formation of the magnetoresistive effect element, changes of the resistance characteristics due to the intrusion of oxygen, hydrogen, etc. and changes of the resistance value due to the reduction of the tunnel insulating film can be effectively prevented.

The first magnetic shield film and the second magnetic shield film enclosing the magnetoresistive effect element are formed in self-alignment with the magnetoresistive effect element, whereby the above-described advantageous effects of the present invention can be produced without making the downsizing and the fabrication process difficult.

DETAILED DESCRIPTION OF THE PREFERRED EMBODIMENTS

The magnetic memory device and the method for fabricating the same according to one embodiment of the present invention will be explained with reference to FIGS. 1 to 8C.

Figure 1:
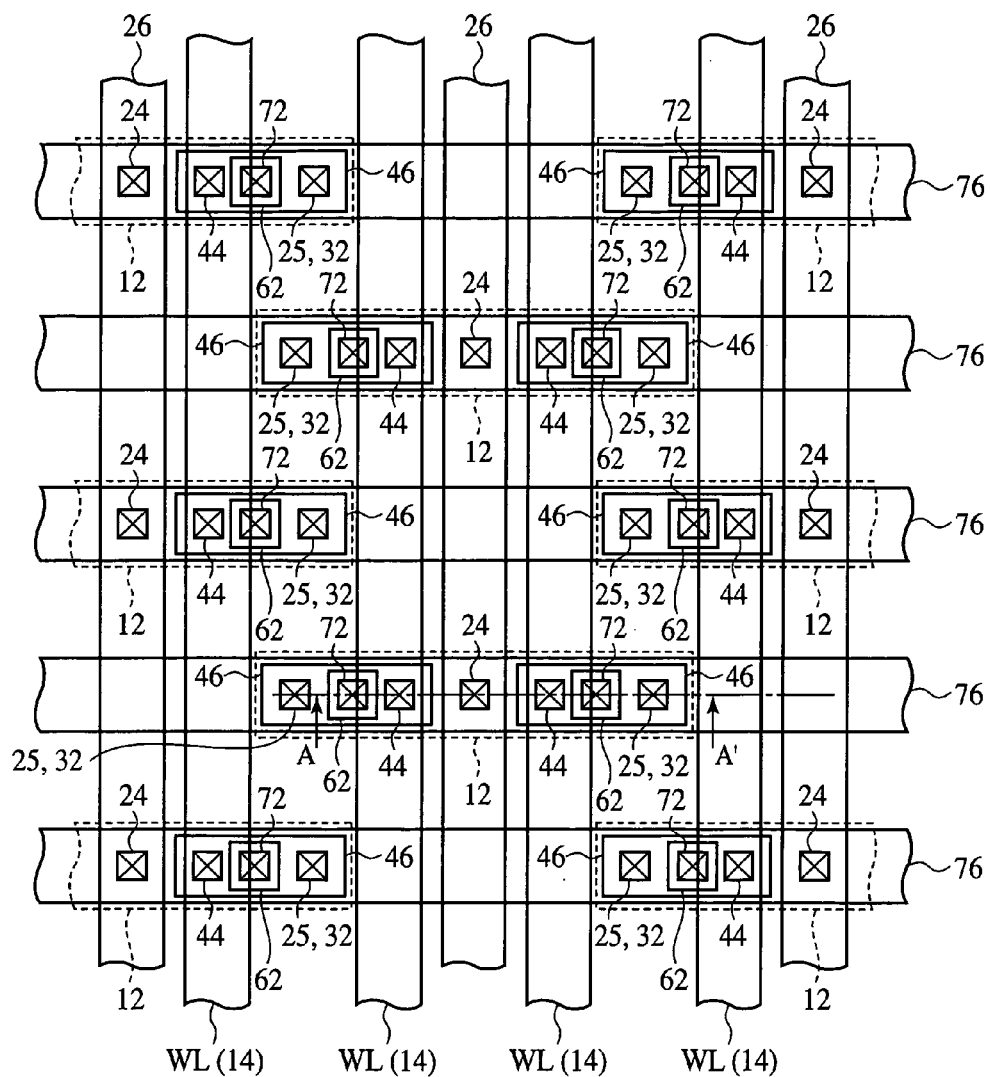
FIG. 1 is a plan view of the magnetic memory device according to one embodiment of the present invention, which shows a structure thereof.
Figure 1:
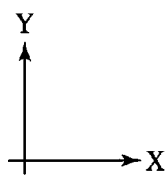
Figure 2A:
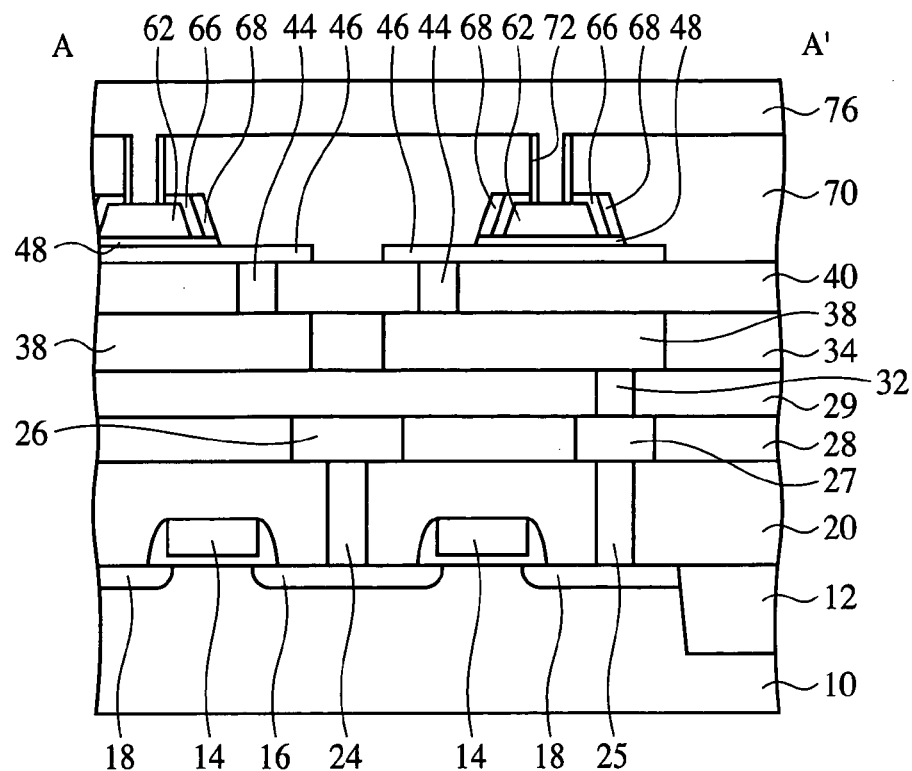
FIGS. 2A and 2B are diagrammatic sectional views of the magnetic memory device according to the embodiment of the present invention, which show the structure thereof.
Figure 2B:
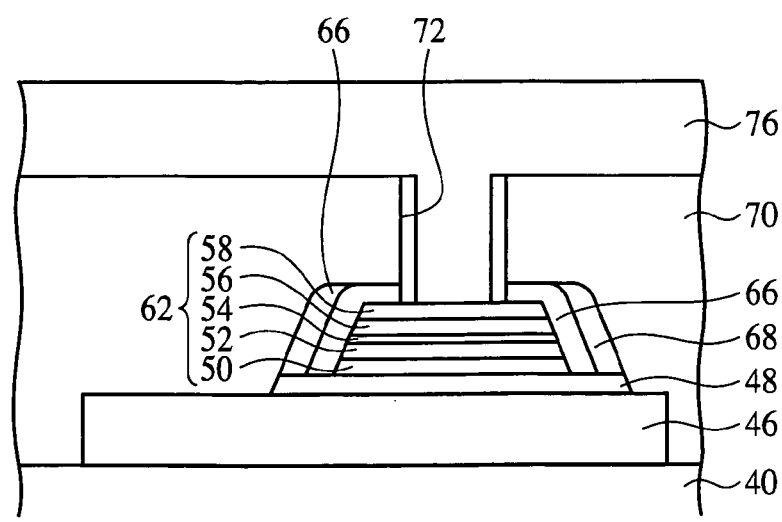

FIG. 1 is a plan view of the magnetic memory device according to the present embodiment, which shows a structure thereof. FIGS. 2A and 2B are diagrammatic sectional views of the magnetic memory device according to the present embodiment, which show the structure thereof. FIGS. 3A-3C, 4A-4B, 5A-5B, 6A-6B, 7A-7D and 8A-8C are sectional views showing the method for fabricating the magnetic memory device according to the present embodiment.

First, the structure of the magnetic memory device according to the present embodiment will be explained with reference to FIGS. 1 to 2B. FIG. 2A is the sectional view along the line A-A' in FIG. 1, and FIG. 2B is an enlarged sectional view of a portion where the magnetoresistive effect element is formed.

A device isolation film 12 for defining a plurality of device regions is formed in the surface of a silicon substrate 10. The plurality device regions each have a rectangular shape which is longer in the X-direction (horizontally as viewed in the drawing) and are laid out zigzag to each other.

Over the silicon substrate 10 with the device isolation film 12 formed in, a plurality of word lines WL are formed, extended in the Y-direction (vertically as viewed in the drawing). The word lines WL are extended two in each device region. In each device region, source/drain regions 16, 18 are formed respectively on both sides of the word lines WL. Thus, in each device region, two select transistors each including a gate electrode 14 formed of the word line WL, and the source/drain regions 16, 18 are formed. The two select transistors formed in one active region have the source/drain regions 16 in common.

An inter-layer insulating film 20 is formed over the silicon substrate 10 with the select transistors formed on. In the inter-layer insulating film 20, contact plugs 24, 25 are buried respectively connected to the source/drain regions 16 and the source/drain regions 18.

An inter-layer insulating film 28 is formed over the inter-layer insulating film 20 with the contact plugs 24, 25 buried in. In the inter-layer insulating film 28, ground lines 26 electrically connected to the source/drain region 16 via the contact plug 24 and interconnections 27 electrically connected to the source/drain region 18 via the contact plug 25 are buried.

Over the inter-layer insulating film 28 with the ground lines 26 and the interconnections 27 buried in, an inter-layer insulating film 29 is formed. In the inter-layer insulating film 29, contact plugs 32 connected to the source/drain regions 18 via the interconnections 27 and the contact plugs 25 are buried.

Over the inter-layer insulating film 29 with the contact plugs 32 buried in, an inter-layer insulating film 34 is formed. In the inter-layer insulating film 34, interconnections 38 electrically connected to the contact plugs 32 are buried.

Over the inter-layer insulating film 34 with the interconnections 38 buried in, an inter-layer insulating film 40 is formed. In the inter-layer insulating film 40, contact plugs 44 connected to the interconnections 38 are buried.

Over the inter-layer insulating film 40 with the contact plugs 44 buried in, local interconnections 46 connected to the contact plugs 44 are formed. The local interconnections 46 are electrically connected to the source/drain regions 18 via the contact plugs 44, the interconnections 38 and the contact plugs 32.

Over the local interconnections 46, magnetoresistive effect elements 62 each having the undersurface covered with a bottom shield film 48 and the side surface covered with a sidewall shield film 68 with an insulating film 66 formed therebetween are formed. As shown in FIG. 2B, each magnetoresistive effect element 62 is a TMR element formed of a layer film of an anti-ferromagnetic layer 50, a pinned magnetization layer 52, a barrier layer 54, a free magnetization layer 56 and a cap layer 60 which are laid one on another and has the upper surface and the side surface covered with an insulating film 66.

Over the inter-layer insulating film 40 with the local interconnections 46 and the magnetoresistive effect elements 62 formed on, an inter-layer insulating film 70 is formed. Over the inter-layer insulating film 70, bit lines 76 are formed, extended in the X-direction and connected to the cap layers 58 of the magnetoresistive effect elements 62 via the contact holes 72.

Thus, a spin injection magnetization reversal-type magnetic memory device including memory cells each including one select transistor and one magnetoresistive effect element is formed.

Here, in the magnetic memory device according to the present embodiment, as shown in FIG. 2B, each magnetoresistive effect element 62 has the undersurface covered with the bottom shield film 48 and the side surface covered with the sidewall shield film 68 with the insulating film 66 formed therebetween. The bottom shield film 48 and the sidewall shield film 68 are magnetic shield formed of a soft magnetic material, such as NiFe or others.

Thus, the magnetic shields are provided, enclosing each magnetoresistive effect element, whereby the leakage magnetic field from the interconnections provided near the magnetoresistive effect element 62 can be effectively prevented from arriving at the magnetoresistive effect element 62. Thus, erroneous operations due to the leakage magnetic field from the interconnections near the magnetoresistive effect elements, such as the magnetization reversal of the free magnetization layer 56 and the fluctuation of the writing current, etc., can be prevented.

The insulating film 66 is formed of a moisture-resistant insulating material, whereby the arrival of impurities, such as oxygen, water, hydrogen, etc., at the magnetoresistive effect elements can be effectively prevented. Accordingly, in the fabrication process after the magnetoresistive effect elements have been formed, changes of the resistance characteristics due to the intrusion of oxygen, hydrogen, etc. and changes of the resistance value due to the reduction of the tunnel insulating film can be effectively prevented.

As will be described below, the magnetic shield enclosing the magnetoresistive effect elements 62 (the bottom shield film 48 and the sidewall shield film 68) can be formed in self-alignment with the magnetoresistive effect elements 62. Accordingly, the advantageous effects of the present invention described above can be produced without making the downsizing and the fabrication process difficult.

Then, the method for fabricating the magnetic memory device according to the present embodiment will be explained with reference to FIGS. 3A to 8C. FIGS. 3A to 6B are sectional view along the line A-A' in FIG. 1 in the steps of the method for fabricating the magnetic memory device, and FIGS. 7A to 8C are sectional views detailing a portion of the magnetoresistive effect elements in the steps of the method for fabricating the magnetic memory device.

First, the device isolation film 12 for defining the device regions is formed in the silicon substrate 10, by, e.g., STI (Shallow Trench Isolation) method.

Figure 3A:
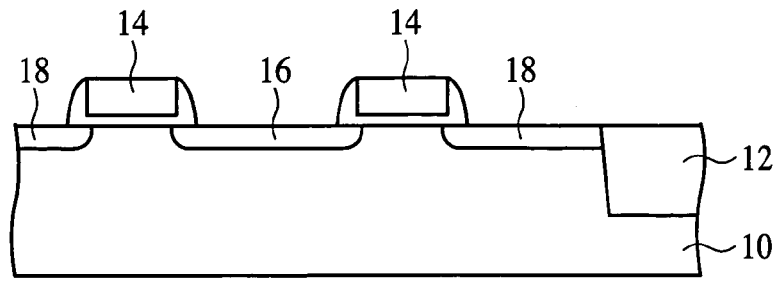
FIGS. 3A-3C, 4A-4B, 5A-5B, 6A-6B, 7A-7D and 8A-8C are sectional views showing the method for fabricating the magnetic memory device according to the embodiment of the present invention.

Then, in each device region defined by the device isolation film 12, select transistors each including the gate electrodes 14 and the source/drain regions 16, 18 are formed in the same way as in the method for fabricating the usual MOS transistor (FIG. 3A).

Next, over the silicon substrate with the select transistors formed on a silicon oxide film is deposited by, e.g., CVD method, and the surface of the silicon oxide film is planarized by CMP method to form the inter-layer insulating film 20 of the silicon oxide film.

Then, the contact holes 22 down to the source/drain regions 16 and the contact holes 23 down to the source/drain regions 18 are formed in the inter-layer insulating film 20 by photolithography and dry etching.

Next, a titanium nitride film as the barrier metal and a tungsten film are deposited by, e.g., CVD method, and then these conductive films are etched back or polished back to form the contact plugs 24 buried in the contact holes 22 and electrically connected to the source/drain regions 16 and the contact plugs 25 buried in the contact holes 23 and electrically connected to the source/drain regions 18.

Then, over the inter-layer insulating film 20 with the contact plugs 24, 25 buried in, a silicon oxide film is deposited by, e.g., CVD method, and the surface of the silicon oxide film is planarized by CMP method as required to form the inter-layer insulating film 28 of the silicon oxide film.

Next, in the inter-layer insulating film 28, an interconnection trenches 26a down to the contact plugs 24 and interconnection trenches 27a down to the contact plugs 25 are formed by photolithography and dry etching.

Figure 3B:
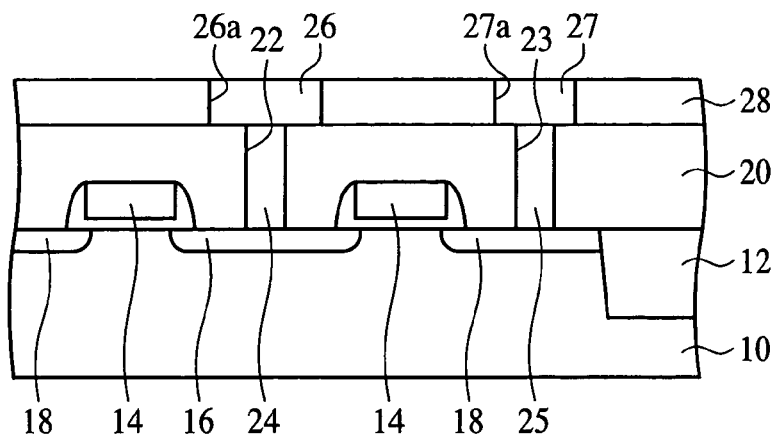

Then, a tantalum film as the barrier metal and a copper film are deposited by, e.g., CVD method, and then these conductive films are etched back or polished back to form the ground lines 26 buried in the interconnection trenches 26a and electrically connected to the source/drain regions 16 via the contact plugs 24 and the interconnections 27 buried in the interconnection trenches 27a and electrically connected to the source/drain regions 18 via the contact plugs 25 (FIG. 3B).

Next, over the inter-layer insulating film 28 with the ground lines 26 and the interconnections 27 buried in, a silicon oxide film is deposited by, e.g., CVD method, and then the surface of the silicon oxide film is planarized by CMP method as required to form the inter-layer insulating film 29 of the silicon oxide film.

Then, the contact holes 30 down to the interconnections 27 are formed in the inter-layer insulating film 29 by photolithography and dry etching.

Figure 3C:
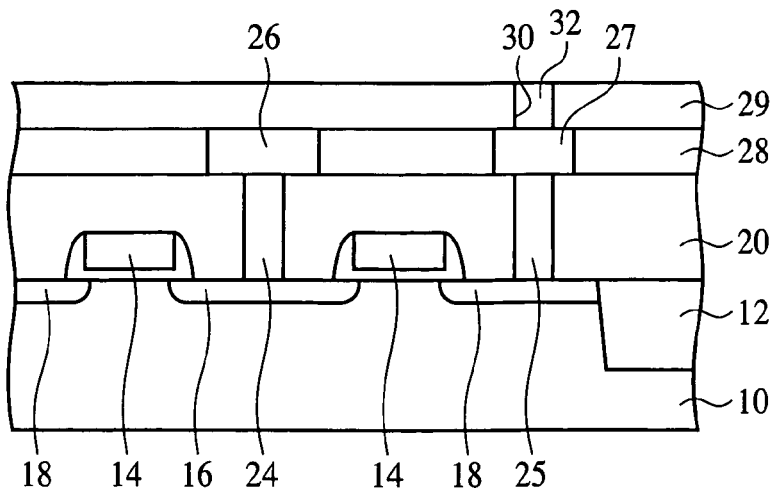

Next, a tantalum film as the barrier metal and a copper film are deposited by, e.g., CVD method, and then these conductive films are etched back or polished back to form the contact plugs 32 buried in the contact holes 30 and electrically connected to the source/drain regions 18 via the interconnections 27 and the contact plugs 25 (FIG. 3C).

Then, over the inter-layer insulating film 29 with the contact plugs 32 buried in, a silicon oxide film is deposited by, e.g., CVD method, and the surface of the silicon oxide film is planarized by CMP method as required to form the inter-layer insulating film 34 of the silicon oxide film.

Next, interconnection trenches 36 down to the contact plugs 32 are formed in the inter-layer insulating film 34 by photolithography and dry etching.

Figure 4A:
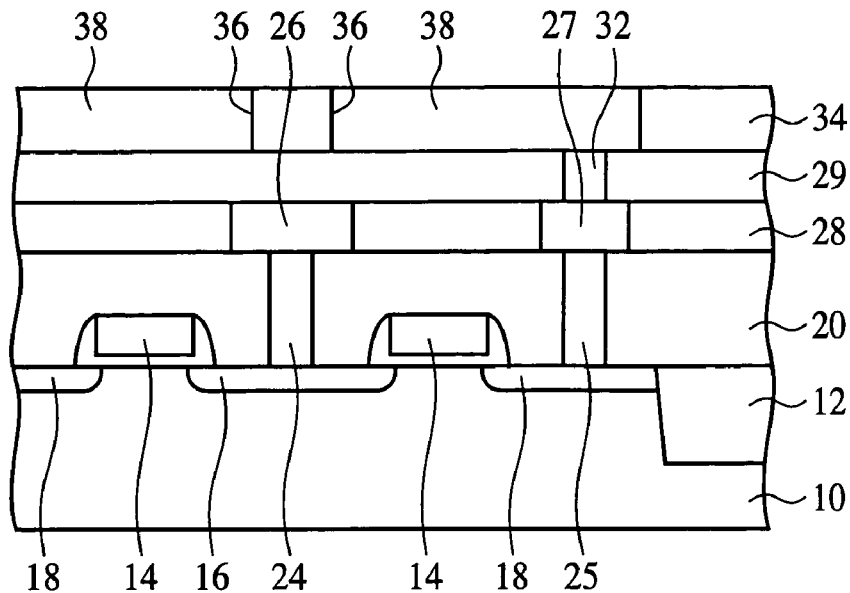

Then, a tantalum film as the barrier metal and a copper film are deposited, and then the copper film and the barrier metal are polished back by CMP down to the surface of the inter-layer insulating film 34 to form the interconnections 38 buried in the interconnection trenches 36 and electrically connected to the source/drain regions 18 via the contact plugs 32 (FIG. 4A).

Next, over the inter-layer insulating film 34 with the interconnections 38 buried in, a silicon nitride film and a silicon oxide film are deposited by, e.g., CVD method, and then the surface of the silicon oxide film is planarized by CMP method as required to form the inter-layer insulating film 40 of the layer structure of the silicon oxide film and the silicon nitride film.

Then, contact holes 42 down to the interconnections 38 are formed in the inter-layer insulating film 40 by photolithography and dry etching.

Figure 4B:
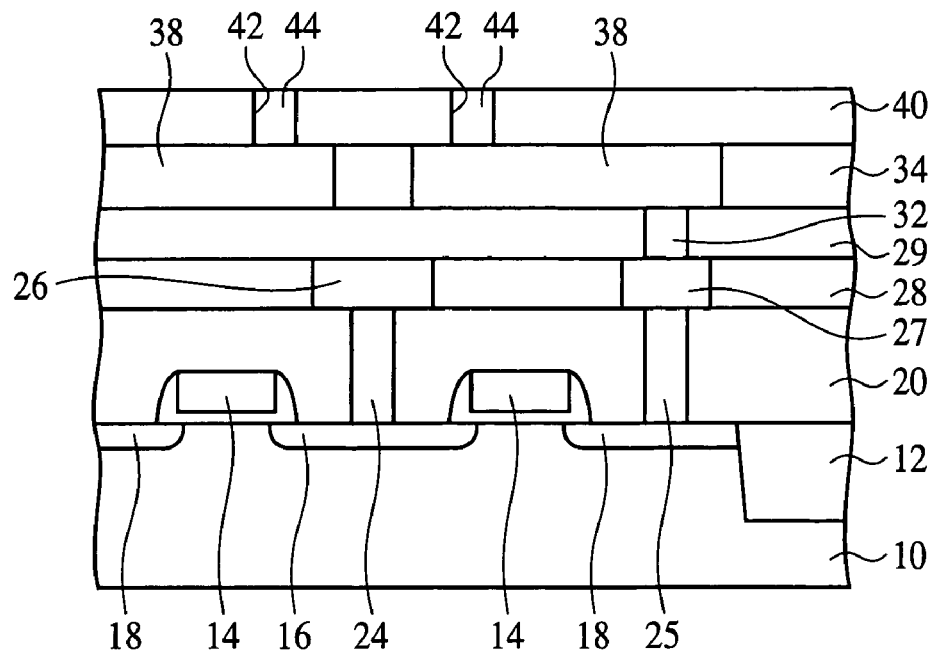

Next, a tantalum film as the barrier metal and a copper film are deposited by, e.g., CVD method, and then these conductive films are etched back or polished back to form the contact plugs 44 buried in the contact holes 42 and electrically connected to the source/drain regions 18 via the interconnections 38 the contact plugs 32 (FIG. 4B).

Then, over the inter-layer insulating film 40 with the contact plugs 44 buried in, a Ta film 46*a*, an NiFe film 48*a*, a PtMn film 50*a* (film thickness: 20 nm), a CoFeB/Ru/CoFe layer film 52*a* (film thickness: 2.5 nm/0.7 nm/2 nm), an MgO film 54*a* (film thickness: 2 nm), a CoFeB film 56*a* (film thickness: 2 nm) and a Ta/Ru layer film 58*a* (film thickness: 30 nm/5 nm) are deposited by, e.g., sputtering method.

Figure 7A:
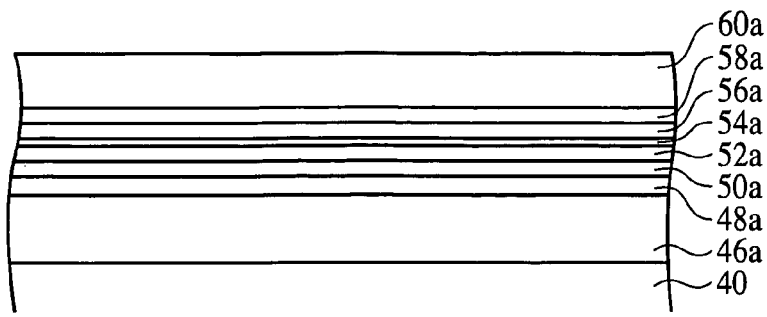

Next, over the Ta/Ru layer film 58*a*, an SiN/SiO layer film 60*a* (film thickness: 20 nm/10 nm) is deposited by, e.g., CVD method (FIG. 7A).

Figure 7B:
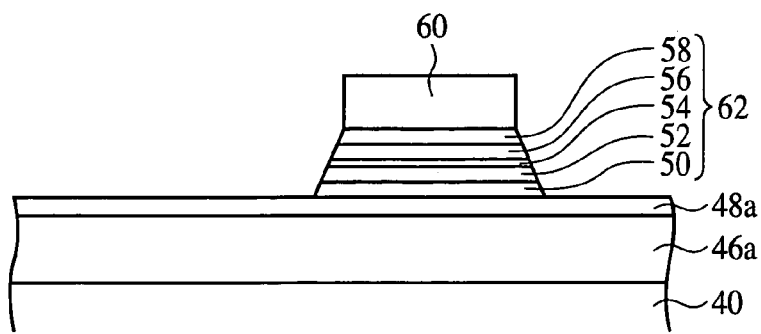

Then, the SiN/SiO layer film 60*a*, the Ta/Ru layer film 58*a*, the CoFeB film 56*a*, the MgO film 54*a*, the CoFeB/Ru/CoFe layer film 52*a* and the PtMn film 50*a* are patterned into, e.g., a 100 nm×200 nm size by photolithography and dry etching to form the magnetoresistive effect elements 62 formed of the layer film of the anti-ferromagnetic layer 50 of the PtMn film 50*a*, the pinned magnetization layer 52 of the synthetic ferrimagnetic structure of the CoFeB/Ru/CoFe layer film 52*a*, the barrier layer 54 of the MgO film 54*a*, the free magnetization layer 56 of the NiFe/CoFe layer film 56*a* and the cap layer 58 of the Ta/Ru layer film 58*a*, and having the upper surface covered with the buffer film 60 of the SiN/SiO layer film 60*a* (FIG. 7B).

The anti-ferromagnetic layer 50 can be formed of an anti-ferromagnetic material, e.g., PtMn, PdPtMn, IrMn, RhMn, RuMn, FeMn or others, containing any one of, e.g., Re, Ru, Rh, Pd, IrPt, Cr, Fe, Ni, Cu, Ag and Au, and Mn. In this case, as the base material for improving the crystal orientation of the anti-ferromagnetic material, the material, such as NiCr, NiFe, Ru, Cu or others, can be used.

The pinned magnetization layer 52 can be formed of a ferromagnetic material containing any one of Co, Fe, Ni, e.g., CoFe, NiFe or others. In forming the synthetic ferrimagnetic structure, a non-magnetic material, such as Ru, Rh, Cr or others, can be used as the coupling film.

The barrier layer 54 can be formed of an oxide material, an oxynitride material or a nitride material containing any one of Mg, Al, Hf, Ti, V, Ta and Si, e.g., MgO, AlO, AlN, HfO, TiO, VO, TaO, SiO or others.

The free magnetization layer 56 can be formed of a ferro-magnetic material containing any one of Co, Fe and Ni, e.g., CoFeB, CoFeNi, CoFeSi, CoFeBSi, FeB, CoFe, NiFe or others.

The cap layer 58 can be formed of a conductive material containing any one of Ta, Ru, Cu, Al, Mg, Ti and TiN.

Figure 7C:
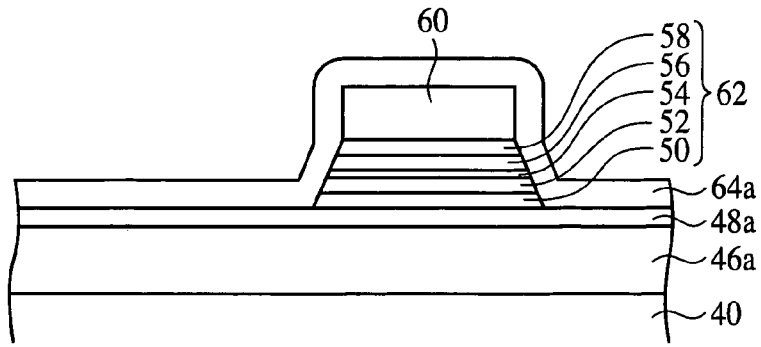
Figure 7D:
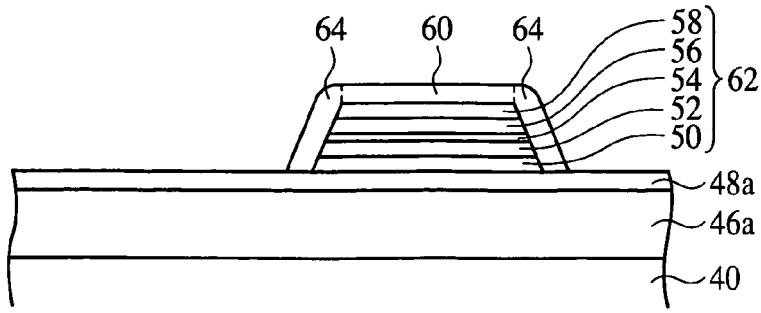

Next, over the NiFe film 48*a* with the magnetoresistive effect elements 62 formed on, an SiN/SiO layer film 64*a* (film thickness: 30 nm/10 nm) is deposited by, e.g., CVD method (FIG. 7C).

Then, the SiN/SiO layer film 64*a* is etched back to form the sidewall insulating film 64 of the SiN/SiO layer film 64*a* on the side walls of the magnetoresistive effect elements 62. At this time, the film thickness of the buffer film 60 and the conditions for the etching back are controlled suitably for the buffer film 60 over the magnetoresistive effect element 62 to remain. In the following explanation, the buffer film 60 and the sidewall insulating film 64 covering the magnetoresistive effect elements 62 are collectively called an insulating film 66.

The insulating film 66 can be formed of a moisture-resistant insulating material, e.g., an insulating material deposited by CVD method and containing Si, e.g., SiO, SiN, SiON or others, an insulating material containing AlO, AlN, AlON, or others.

For the moisture resistance, the insulating film 66 preferably covers the side walls and the upper surfaces of the magnetoresistive effect elements 62. When the insulating film 66 is provided only on the side walls of the magnetoresistive effect elements 62, however, the effect of improving the moisture resistance can be produced. Accordingly, the side walls alone of the magnetoresistive effect elements 62 may be covered with the insulating film 66. In this case, the buffer film 60 may not be provided or may be formed thin.

Figure 8A:
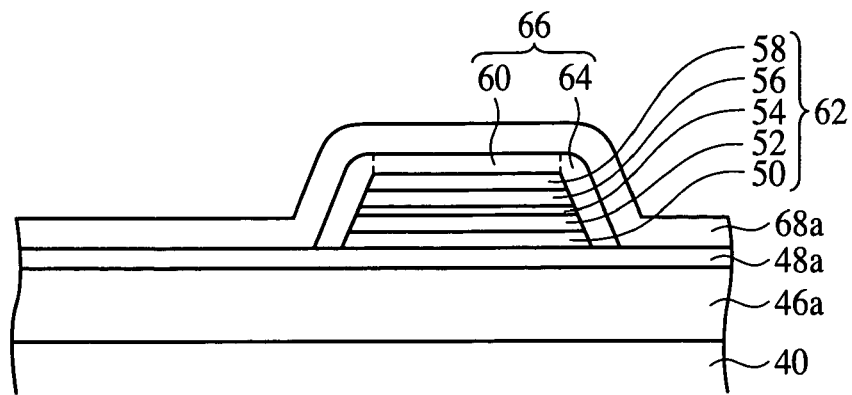

Next, over the NiFe film 48*a*, on which the magnetoresistive effect elements 62 covered with the insulating film 66 are formed, an NiFe film 68*a* of, e.g., a 50 nm-thickness is deposited by, e.g., sputtering method (FIG. 8A).

Figure 8B:
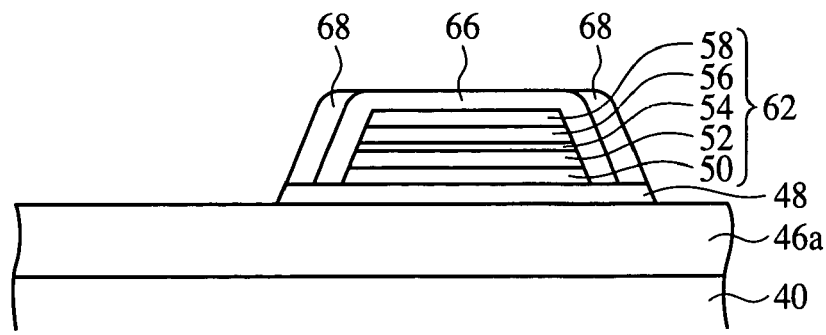

Then, the NiFe film 68*a* and the NiFe film 48*a* are etched back to form the sidewall shield film 68 of the NiFe film 68*a* formed on the side walls of the magnetoresistive effect elements 62 covered with the insulating film 66, and the bottom shield film 48 of the NiFe film 48*a* formed on the bottoms of the magnetoresistive effect elements 62 (FIG. 8B). At this time, as long as the NiFe film 68*a* on the upper surfaces of the magnetoresistive effect elements 62 is removed, the NiFe film 48*a* on the Ta film 46*a* may remain.

The bottom shield film 48 and the sidewall shield film 68 can be formed of a soft magnetic material having high magnetic permeability and soft magnetic characteristics and containing any one of Co, Fe and Ni, e.g., NiFe, CoFe, NiCoFe, CoFeB, CoFeBSi, CoFeBNi or others.

Figure 8C:
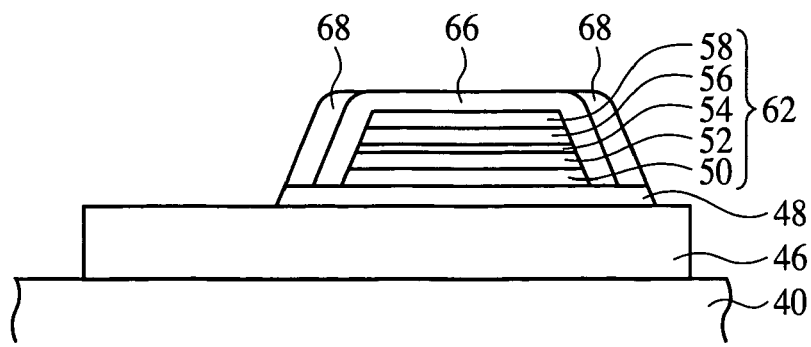

Next, the Ta film 46*a* is patterned by photolithography and dry etching to form the local interconnections 46 of the Ta film 46*a* (FIG. 8C).

Figure 5A:
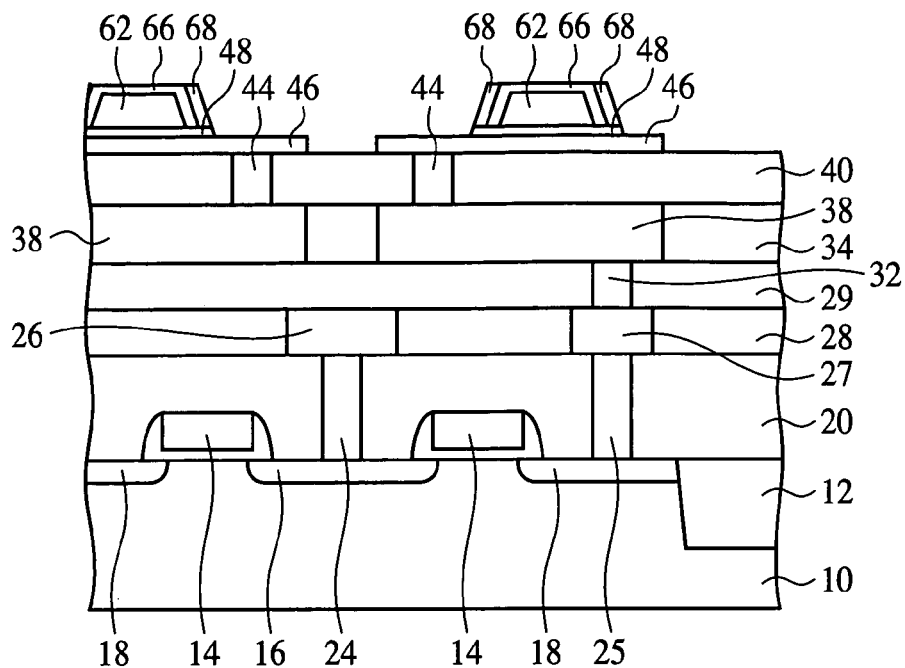

Thus, the local interconnections 46 connected to the contact plugs 44, and the magnetoresistive effect elements 62 formed over the local interconnections 46 and having the undersurfaces covered with the bottom shield film 48 and the side walls covered with the sidewall shield film 66 are formed over the inter-layer insulating film 40 (FIG. 5A).

Then, a silicon oxide film is deposited by, e.g., CVD method over the inter-layer insulating film 40 with the local interconnections 46 and the magnetoresistive effect elements 62 formed on, and then the surface of the silicon oxide film is planarized by CMP method to form the inter-layer insulating film 70 of the silicon oxide film.

Figure 5B:
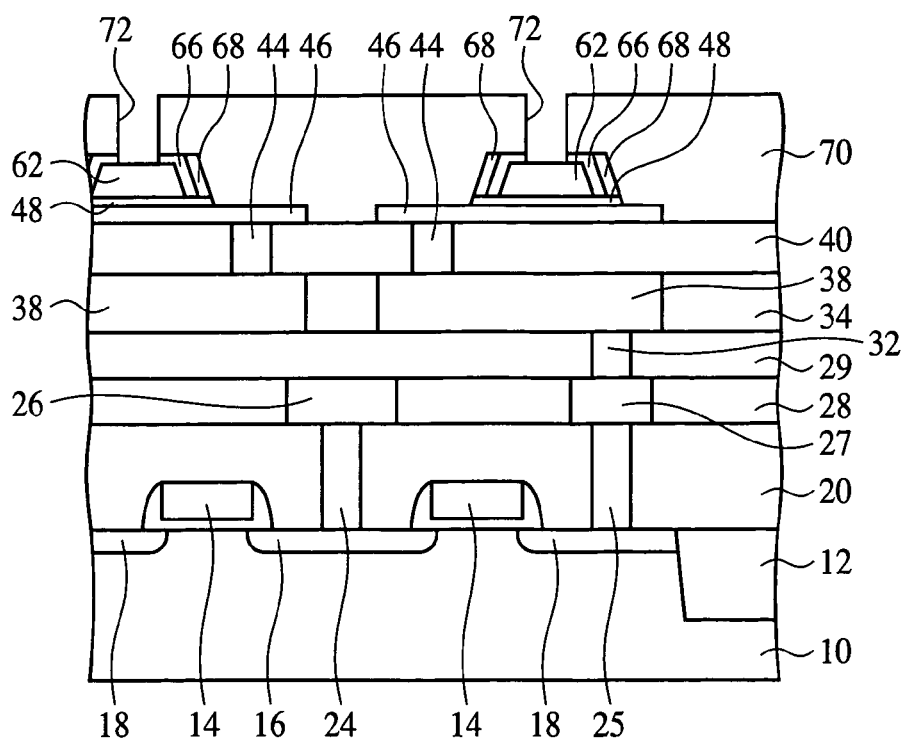

Next, contact holes 72 down to the cap layers 58 of the magnetoresistive effect elements 62 are formed in the inter-layer insulating film 70 and the insulating film 66 by photo-lithography and dry etching (FIG. 5B).

Figure 6A:
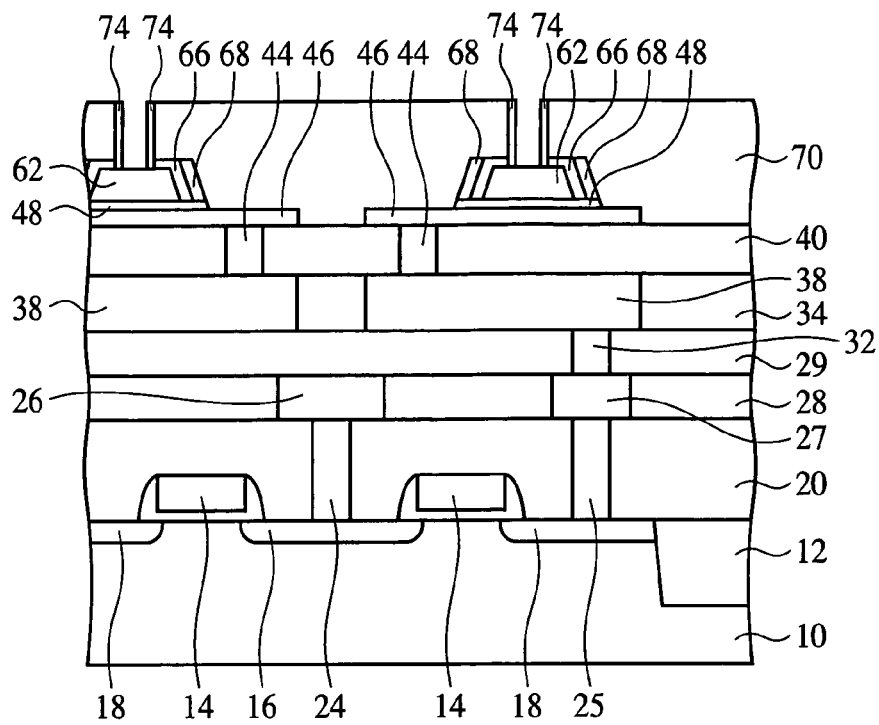

Then, a silicon oxide film, for example, is deposited and etched back as required to form an insulating protection film 74 for the leakage current prevention on the inside walls of the contact holes 72 (FIG. 6A).

Figure 6B:
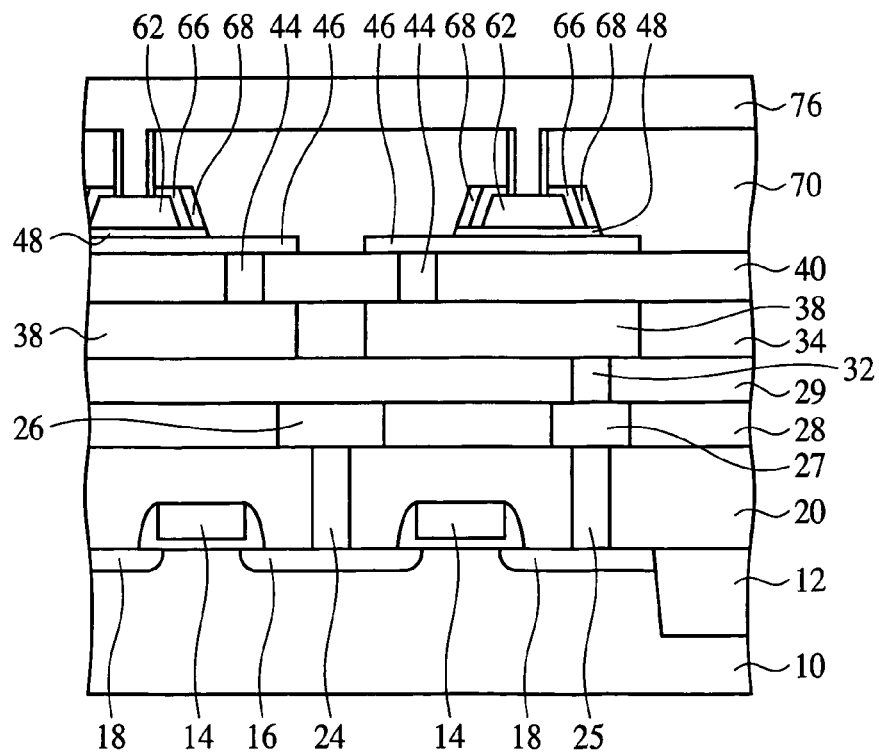

Next, over the inter-layer insulating film 70 with the contact holes 72 formed in, bit lines 76 electrically connected to the magnetoresistive effect elements 62 via the contact holes 72 are formed (FIG. 6B).

Then, insulating layers, interconnections, etc., are formed thereon as required to complete the magnetic memory device.

As described above, according to the present embodiment, the magnetoresistive effect elements have the undersides covered with the bottom shield film and the side walls covered with the sidewall shield film, whereby the leakage magnetic field from the interconnections near the magnetoresistive effect elements are effectively hindered from arriving at the magnetoresistive effect elements. Thus, erroneous operations due to the leakage magnetic field from the interconnections near the magnetoresistive effect elements, such as the magnetization reversal of the free magnetic layers of the magnetoresistive effect elements and the fluctuation of the writing current, etc. can be prevented.

The sidewall shield film is provided with the moisture-resistant insulating film formed therebetween, whereby impurities, such as oxygen, water, hydrogen, etc. can be effectively hindered from arriving at the magnetoresistive effect elements. Thus, in the fabrication process after the magnetoresistive effect elements have been formed, changes of the resistance characteristics due to the intrusion of oxygen, hydrogen, etc. and changes of the resistance value due to the reduction of the tunnel insulating film can be effectively prevented.

The bottom shield film and the sidewall shield film covering the magnetoresistive effect elements are formed in self-alignment with the magnetoresistive effect elements, whereby the above-described advantageous effects of the present invention can be produced without making the downsizing and the fabrication process difficult.

Modified Embodiments

The present invention is not limited to the above-described embodiment and can cover other various modifications.

For example, in the above-described embodiment, the present invention is applied to the magnetic memory device including the TMR-type magnetoresistive effect elements. But the present invention is applicable to magnetic memory devices including GMR-type magnetoresistive effect elements. In this case, a conductive non-magnetic layer may be provided in place of the barrier layer 54. The positional relationship between the pinned magnetization layer 52 and the free magnetization layer may be upside down.

In the above-described embodiment, the pinned magnetization layer 52 has the synthetic ferrimagnetic structure of CoFeB/Ru/CoFe, whereby the leakage magnetic field from the pinned magnetization layer 52 can be decreased. However, the pinned magnetization layer may the single layer structure of, e.g., CoFe.

In the above-described embodiment, the free magnetization layer 56 has the single layer structure of CoFeB but may have the layer structure of NiFe/CoFe or others and may have the synthetic ferrimagnetic structure of, e.g., CoFeB/Ru/CoFeB, CoFe/Rh/CoFeB or others.

In the above-described embodiment, the present invention is applied to the magnetic memory device comprising memory cells each including one select transistor and one magnetoresistive effect element. But the constitution of the memory cell is not limited to this. For example, the present invention is applicable also to the magnetic memory device comprising memory cells each including two select transistors and two magnetoresistive effect element, and the magnetic memory device comprising memory cells each including one select transistor and two magnetoresistive effect elements.

In the above-described embodiment, the local interconnections 46 are provided below the magnetoresistive effect elements 62 but are not essentially necessary. The local interconnections 46 are provided in the present embodiment because the magnetoresistive effect elements 62 are formed over the interconnections 38 formed of copper as a main component. That is, the local interconnections 46 are provided as the buffers because, from the view point of the fabrication process, it is difficult to form the magnetoresistive effect elements immediately on the copper interconnections. Accordingly, the local interconnections 46 are not essentially necessary when the interconnection layer is not formed of copper or when the magnetoresistive effect elements are not formed immediately on the copper interconnection layer. Otherwise, the local interconnections 46 or the bottom shield film 48 may be formed, directly connected to the contact plugs 32.

In the above-described embodiment, both the bottom shield film 48 and the sidewall shield film 68 are provided. But, depending on an arrangement of the interconnections adjacent to the magnetoresistive effect elements 62, either of the bottom shield film 48 and the side-wall shield film 68 may be provided.

What is claimed is:

1. A magnetic memory device comprising:
    a first magnetic shield film;
    a magnetoresistive effect element formed over the first magnetic shield film and including a first magnetic layer, a non-magnetic layer formed on the first magnetic layer and a second magnetic layer formed on the non-magnetic layer, in which a magnetization direction of the first magnetic layer or the second magnetic layer is reversed by spin injection;
    a second magnetic shield film formed over a side wall of the magnetoresistive effect element; and
    an insulating film formed between the magnetoresistive effect element and the second magnetic shield film.

2. The magnetic memory device according to claim 1, wherein the insulating film is formed over the side wall and an upper surface of the magnetoresistive effect element.

3. The magnetic memory device according to claim 1, wherein the insulating film is formed of a moisture-resistant insulating material.

4. The magnetic memory device according to claim 3, wherein
    the insulating material contains at least one insulating material selected from the group consisting of SiO, SiN, SiON, AlO, AlN and AlON.

5. The magnetic memory device according to claim 1, wherein
    the insulating film is formed in self-alignment with the magnetoresistive effect element.

6. The magnetic memory device according to claim 1, wherein
    the second magnetic shield film is formed in self-alignment with the magnetoresistive effect element and the insulating film.

7. The magnetic memory device according to claim 1, further comprising:

a select transistor electrically connected to the magnetoresistive effect element via the first magnetic shield film.

8. A method for fabricating a magnetic memory device:
forming a first magnetic shield film;
forming over the first magnetic shield film a magnetoresistive effect element including a first magnetic layer, a non-magnetic aver formed on the first magnetic layer and a second magnetic aver formed on the non-magnetic layer;
forming an insulating film for covering the magnetoresistive effect element; and
forming a second magnetic shield film over a side wall of the magnetoresistive effect element with the insulating film formed on.

9. The method for fabricating a magnetic memory device according to claim 8,
in the step of forming the insulating film, the insulating film is deposited and etched back to form in self-alignment with the magnetoresistive effect element.

10. The method for fabricating a magnetic memory device according to claim 9, wherein
in the step of forming the magnetoresistive effect element, the magnetoresistive effect element having an upper surface covered with a buffer insulating film is formed, and
in the step of forming the insulating film, the insulating film is etched back, leaving the buffer insulating film over the magnetoresistive effect element.

11. A method for fabricating a magnetic memory device comprising:
forming a first magnetic shield film;
forming over the first magnetic shield film a magnetoresistive effect element including a first magnetic layer, a non-magnetic layer formed on the first magnetic layer and a second magnetic aver formed on the non-magnetic layer;
forming a second magnetic shield film over a side wall of the magnetoresistive effect element, wherein a magnetic material having soft magnetic characteristics and etched back to form the second magnetic shield film in self-alignment with the magnetoresistive effect element.

* * * * *